US010993312B2

(12) United States Patent
Kumar et al.

(10) Patent No.: US 10,993,312 B2
(45) Date of Patent: Apr. 27, 2021

(54) SYSTEM AND METHOD FOR GROUND VIA OPTIMIZATION FOR HIGH SPEED SERIAL INTERFACES (71) Applicant: DELL PRODUCTS, LP, Round Rock, TX (US)

(72) Inventors: Sanjay Kumar, Jharkhand (IN); Bhyrav M. Mutnury, Austin, TX (US)

(73) Assignee: Dell Products L.P., Round Rock, TX (US)

(*) Notice: Subject to any disclaimer, the term of this patent is extended or adjusted under 35 U.S.C. 154(b) by 3 days.

(21) Appl. No.: 16/385,579

(22) Filed: Apr. 16, 2019

(65) Prior Publication Data

US 2020/0337148 A1 Oct. 22, 2020

(51) Int. Cl.
*H05K 1/02* (2006.01)

(52) U.S. Cl.
CPC ........ *H05K 1/0222* (2013.01); *H05K 1/0225* (2013.01); *H05K 1/0245* (2013.01); *H05K 2201/093* (2013.01); *H05K 2201/09609* (2013.01)

(58) Field of Classification Search
None
See application file for complete search history.

(56) References Cited

U.S. PATENT DOCUMENTS

| | | | | |
|---|---|---|---|---|
| 6,137,064 A * | 10/2000 | Kiani | ................... | H05K 1/0222 174/261 |
| 6,181,004 B1 * | 1/2001 | Koontz | ................ | H05K 1/0216 257/664 |
| 6,639,154 B1 * | 10/2003 | Cartier | ................... | H01R 24/50 174/255 |
| 7,335,976 B2 * | 2/2008 | Chen | ................... | H01L 23/5222 257/690 |
| 7,548,994 B2 | 6/2009 | Ali et al. | | |
| 7,645,944 B2 * | 1/2010 | Casher | ................. | H05K 1/0219 174/262 |
| 7,705,246 B1 * | 4/2010 | Pritchard | ............. | H05K 1/0245 174/262 |
| 7,804,680 B2 | 9/2010 | Mundt et al. | | |
| 8,030,580 B2 * | 10/2011 | Motohashi | ............. | H05K 1/114 174/262 |
| 8,694,709 B2 | 4/2014 | Loffink | | |
| 9,787,028 B2 * | 10/2017 | Enriquez-Shibayama | ................... | H01R 12/737 |
| 10,054,979 B1 * | 8/2018 | Liao | ...................... | H05K 3/4038 |
| 10,187,972 B2 * | 1/2019 | Charbonneau | ..... | H01R 12/7082 |
| 10,231,325 B1 * | 3/2019 | Chengson | ............ | H05K 1/0228 |
| 2003/0123238 A1 * | 7/2003 | Yu | ......................... | H05K 1/0218 361/780 |
| 2004/0053014 A1 * | 3/2004 | Sato | ..................... | H05K 1/0222 428/195.1 |

(Continued)

*Primary Examiner* — Timothy J. Dole
*Assistant Examiner* — Muhammed Azam
(74) *Attorney, Agent, or Firm* — Larson Newman, LLP (57) ABSTRACT A printed circuit board (PCB) for an information handling system includes first and second signal vias, and a quantity of ground vias. The first signal via is separated from the second signal via by a first distance. The ground vias are grouped into pairs and each ground via of each pair is separated from one of the first or second signal vias by a second distance. The location of the ground vias in terms of an angle between the ground vias is given as an expression relating the first distance, the second distance, and the quantity of ground vias.

20 Claims, 4 Drawing Sheets

(56) References Cited

U.S. PATENT DOCUMENTS

| | | | |
|---|---|---|---|
| 2005/0202722 A1* | 9/2005 | Regnier | H05K 1/0222 439/607.05 |
| 2006/0076668 A1* | 4/2006 | Kim | H05K 1/0216 257/691 |
| 2006/0228912 A1* | 10/2006 | Morlion | H01R 23/688 439/65 |
| 2007/0205847 A1* | 9/2007 | Kushta | H05K 1/0222 333/33 |
| 2009/0049414 A1* | 2/2009 | Mutnury | H05K 1/0251 716/132 |
| 2010/0048043 A1* | 2/2010 | Morlion | H05K 1/114 439/78 |
| 2010/0144174 A1* | 6/2010 | Glover | H01R 13/6587 439/108 |
| 2010/0289596 A1* | 11/2010 | Makino | H05K 1/0222 333/32 |
| 2015/0186281 A1 | 7/2015 | Cherian et al. | |
| 2016/0044818 A1 | 2/2016 | Bologna et al. | |
| 2016/0150633 A1* | 5/2016 | Cartier, Jr. | H05K 1/0222 174/251 |
| 2016/0316562 A1* | 10/2016 | Mundt | H05K 1/0222 |
| 2017/0271735 A1* | 9/2017 | Kagaya | H01P 5/028 |
| 2018/0032390 A1 | 2/2018 | Rahmanian et al. | |
| 2018/0294076 A1 | 10/2018 | Farkas et al. | |
| 2018/0356994 A1 | 12/2018 | Berke et al. | |
| 2020/0337148 A1* | 10/2020 | Kumar | H05K 1/0225 |

* cited by examiner

SYSTEM AND METHOD FOR GROUND VIA OPTIMIZATION FOR HIGH SPEED SERIAL INTERFACES

FIELD OF THE DISCLOSURE

This disclosure generally relates to information handling systems, and more particularly relates to ground via optimization for high speed serial interfaces.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

SUMMARY

A printed circuit board for an information handling system may include first and second signal vias, and a quantity of ground vias. The first signal via may be separated from the second signal via by a first distance. The ground vias may be grouped into pairs and each ground via of each pair is separated from one of the first or second signal vias by a second distance. The location of the ground vias in terms of an angle between the ground vias may be given as an expression relating the first distance, the second distance, and the quantity of ground vias.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
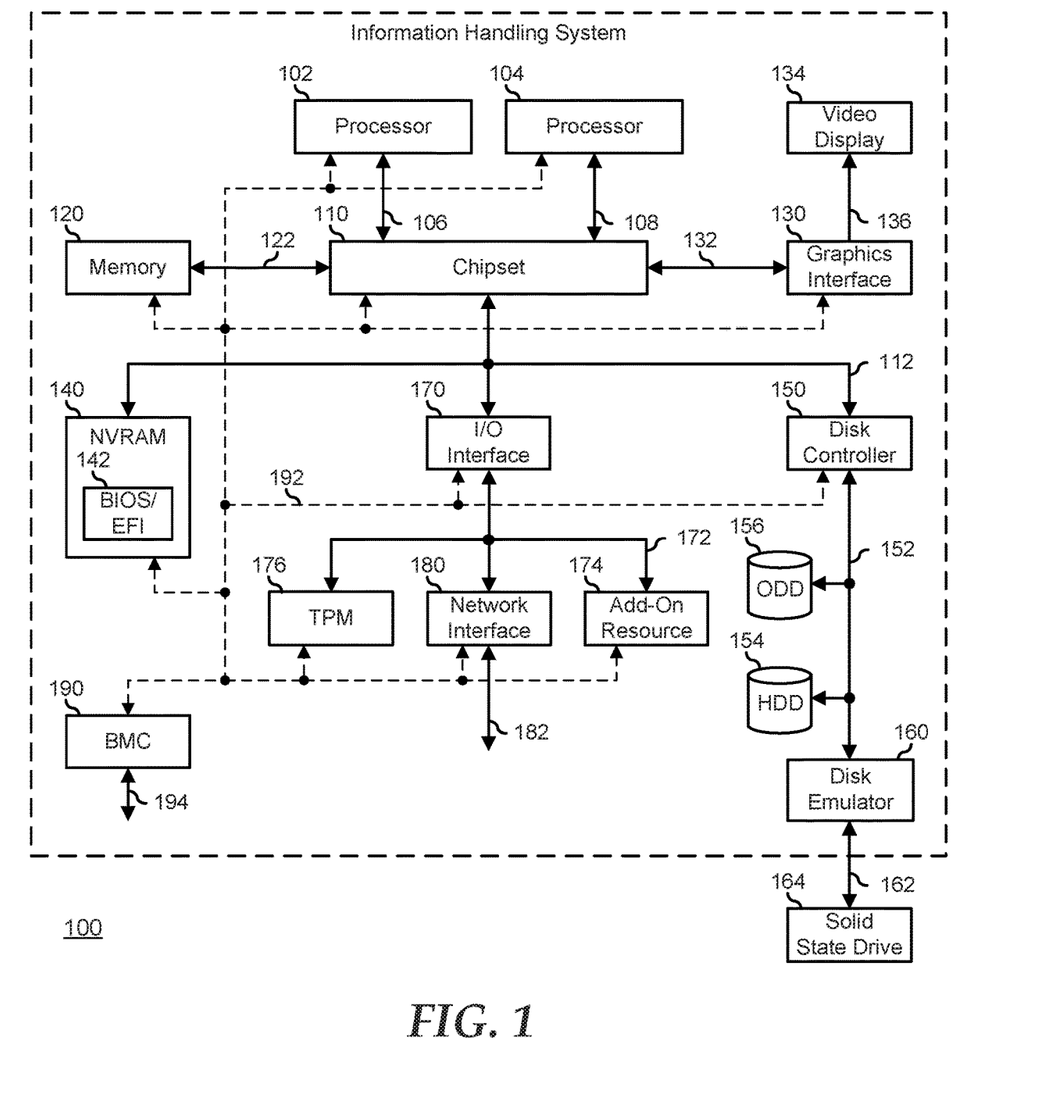
FIG. 1 is a block diagram of an information handling system according to an embodiment of the present disclosure.

FIG. 1 illustrates an embodiment of an information handling system 100 including processors 102 and 104, a chipset 110, a memory 120, a graphics adapter 130 connected to a video display 134, a non-volatile RAM (NV-RAM) 140 that includes a basic input and output system/extensible firmware interface (BIOS/EFI) module 142, a disk controller 150, a hard disk drive (HDD) 154, an optical disk drive (ODD) 156, a disk emulator 160 connected to a solid state drive (SSD) 164, an input/output (I/O) interface 170 connected to an add-on resource 174 and a trusted platform module (TPM) 176, a network interface 180, and a baseboard management controller (BMC) 190. Processor 102 is connected to chipset 110 via processor interface 106, and processor 104 is connected to the chipset via processor interface 108. In a particular embodiment, processors 102 and 104 are connected together via a high-capacity coherent fabric, such as a HyperTransport link, a QuickPath Interconnect, or the like. Chipset 110 represents an integrated circuit or group of integrated circuits that manages the data flows between processors 102 and 104 and the other elements of information handling system 100. In a particular embodiment, chipset 110 represents a pair of integrated circuits, such as a northbridge component and a southbridge component. In another embodiment, some or all of the functions and features of chipset 110 are integrated with one or more of processors 102 and 104. Memory 120 is connected to chipset 110 via a memory interface 122.

An example of memory interface 122 includes a Double Data Rate (DDR) memory channel and memory 120 represents one or more DDR Dual In-Line Memory Modules (DIMMs). In a particular embodiment, memory interface 122 represents two or more DDR channels. In another embodiment, one or more of processors 102 and 104 include a memory interface that provides a dedicated memory for the processors. A DDR channel and the connected DDR DIMMs can be in accordance with a particular DDR standard, such as a DDR3 standard, a DDR4 standard, a DDR5 standard, or the like. Memory 120 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like. Graphics adapter 130 is connected to chipset 110 via a graphics interface 132, and provides a video display output 134 to a video display interface 136. An example of a graphics interface 132 includes a Peripheral Component Interconnect-Express (PCIe) interface and graphics adapter 130 can include a four lane (x4) PCIe adapter, an eight lane (x8) PCIe adapter, a 16-lane (x16) PCIe adapter, or another configuration, as needed or desired. In a particular embodiment, graphics adapter 130 is provided down on a system printed circuit board (PCB). Video display output 136 can include a Digital Video Interface (DVI), a High-Definition Multimedia Interface (HDMI), a DisplayPort interface, or the like, and video display 136 can include a monitor, a smart television, an embedded display such as a laptop computer display, or the like.

NV-RAM 140, disk controller 150, and I/O interface 170 are connected to chipset 110 via an I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disc controller to a hard disk drive (HDD) 154, to an optical disk drive (ODD) 156, and to disk emulator 160. An example of disk interface 152 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 160 permits a solid-state drive (SSD) 164 to be connected to information handling system 100 via an external interface 162. An example of external interface 162 includes a USB interface, an IEEE 1394 (Firewire) interface, a proprietary interface, or a combination thereof. Alternatively, solid-state drive 164 can be disposed within information handling system 100.

I/O interface 170 includes a peripheral interface 172 that connects the I/O interface to add-on resource 174, to TPM 176, and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a network interface card (NIC), a sound/video processing card, another add-on resource, or a combination thereof. Add-on resource 174 can be on a main circuit board, on separate circuit board or add-in card disposed within information handling system 100, a device that is external to the information handling system, or a combination thereof.

Network interface 180 represents a network communication device disposed within information handling system 100, on a main circuit board of the information handling system, integrated onto another component such as chipset 110, in another suitable location, or a combination thereof. Network interface device 180 includes a network channel 182 that provides an interface to devices that are external to information handling system 100. In a particular embodiment, network channel 182 is of a different type than peripheral channel 172 and network interface 180 translates information from a format suitable to the peripheral channel to a format suitable to external devices. In a particular embodiment, network interface 180 includes a network interface card (NIC) or host bus adapter (HBA), and an example of network channel 182 includes an InfiniBand channel, a Fibre Channel, a Gigabit Ethernet channel, a proprietary channel architecture, or a combination thereof. In another embodiment, network interface 180 includes a wireless communication interface, and network channel 182 includes a WiFi channel, a near-field communication (NFC) channel, a Bluetooth or Bluetooth-Low-Energy (BLE) channel, a cellular based interface such as a Global System for Mobile (GSM) interface, a Code-Division Multiple Access (CDMA) interface, a Universal Mobile Telecommunications System (UMTS) interface, a Long-Term Evolution (LTE) interface, or another cellular based interface, or a combination thereof.

Network channel 182 can be connected to an external network resource (not illustrated). The network resource can include another information handling system, a data storage system, another network, a grid management system, another suitable resource, or a combination thereof. BMC 190 is connected to multiple elements of information handling system 100 via one or more management interface 192 to provide out of band monitoring, maintenance, and control of the elements of the information handling system. As such, BMC 190 represents a processing device different from processor 102 and processor 104, which provides various management functions for information handling system 100. For example, BMC 190 may be responsible for power management, cooling management, and the like.

The term baseboard management controller (BMC) is often used in the context of server systems, while in a consumer-level device a BMC may be referred to as an embedded controller (EC). A BMC included at a data storage system can be referred to as a storage enclosure processor. A BMC included at a chassis of a blade server can be referred to as a chassis management controller and embedded controllers included at the blades of the blade server can be referred to as blade management controllers. Capabilities and functions provided by BMC 190 can vary considerably based on the type of information handling system. BMC 190 can operate in accordance with an Intelligent Platform Management Interface (IPMI). Examples of BMC 190 include an Integrated Dell Remote Access Controller (iDRAC).

Management interface 192 represents one or more out-of-band communication interfaces between BMC 190 and the elements of information handling system 100, and can include an Inter-Integrated Circuit (I2C) bus, a System Management Bus (SMBUS), a Power Management Bus (PMBUS), a Low Pin Count (LPC) interface, a serial bus such as a Universal Serial Bus (USB) or a Serial Peripheral Interface (SPI), a network interface such as an Ethernet interface, a high-speed serial data link such as a Peripheral Component Interconnect-Express (PCIe) interface, a Network Controller Sideband Interface (NC-SI), or the like. As used herein, out-of-band access refers to operations performed apart from a BIOS/operating system execution environment on information handling system 100, that is apart from the execution of code by processors 102 and 104 and procedures that are implemented on the information handling system in response to the executed code.

BMC 190 operates to monitor and maintain system firmware, such as code stored in BIOS/EFI module 142, option ROMs for graphics interface 130, disk controller 150, add-on resource 174, network interface 180, or other elements of information handling system 100, as needed or desired. In particular, BMC 190 includes a network interface 194 that can be connected to a remote management system to receive firmware updates, as needed or desired. Here, BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

BMC 190 utilizes various protocols and application programming interfaces (APIs) to direct and control the processes for monitoring and maintaining the system firmware. An example of a protocol or API for monitoring and maintaining the system firmware includes a graphical user interface (GUI) GUI associated with BMC 190, an interface defined by the Distributed Management Taskforce (DMTF) (such as a Web Services Management (WS-MAN) interface, a Management Component Transport Protocol (MCTP) or, a Redfish interface), various vendor defined interfaces (such as a Dell EMC Remote Access Controller Administrator (RACADM) utility, a Dell EMC OpenManage Server Administrator (OMSS) utility, a Dell EMC OpenManage Storage Services (OMSS) utility, or a Dell EMC OpenManage Deployment Toolkit (DTK) suite), a BIOS setup utility such as invoked by a "F2" boot option, or another protocol or API, as needed or desired.

In a particular embodiment, BMC 190 is included on a main circuit board (such as a baseboard, a motherboard, or any combination thereof) of information handling system 100, or is integrated onto another element of the information handling system such as chipset 110, or another suitable element, as needed or desired. As such, BMC 190 can be part of an integrated circuit or a chip set within information handling system 100. An example of BMC 190 includes an integrated Dell remote access controller (iDRAC), or the like. BMC 190 may operate on a separate power plane from other resources in information handling system 100. Thus BMC 190 can communicate with the management system via network interface 194 while the resources of information handling system 100 are powered off. Here, information can be sent from the management system to BMC 190 and the information can be stored in a RAM or NV-RAM associated with the BMC. Information stored in the RAM may be lost after power-down of the power plane for BMC 190, while information stored in the NV-RAM may be saved through a power-down/power-up cycle of the power plane for the BMC.

Via structures play an important role in printed circuit board (PCB) design where circuit traces need to be transitioned from one layer in the PCB to another. In particular, vias are utilized where AC coupling capacitors are provided, where a ball-grid array (BGA) is mounted to the surface of the PCB, and in other locations on the PCB, as needed or desired. As the speed of signals increases, ground (GND) vias, that is, vias that are placed proximate to the signal vias, are utilized to ensure a good current return path for the signals. Further, where the signal speeds increase, for example to 25 gigabits per second (Gbps), 32 Gbps, or beyond, the location of the via structures needs to be optimized to achieve the best signal quality. Otherwise, subtle effects from via crosstalk and reflections get magnified into the high speeds signal traces.

Figure 2:
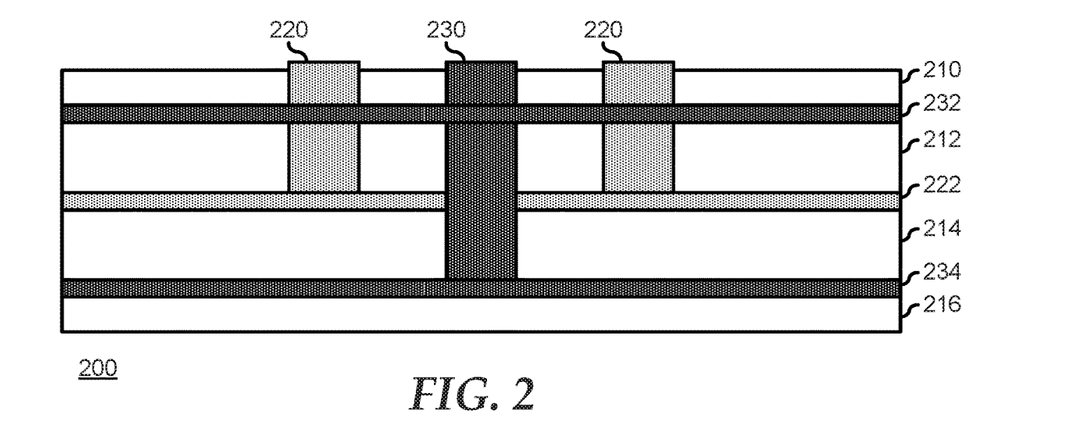
FIG. 2 is an edge view of a printed circuit board (PCB) according to an embodiment of the present disclosure.

FIG. 2 illustrates an edge view of a PCB 200. PCB 200 has insulating layers 210, 212, 214, and 216 and conducting layers 222, 232, and 234. PCB 200 is arranged such that insulating layer 210 is a top layer, conducting layer 232 is sandwiched between insulating layers 210 and 212, conducting layer 222 is sandwiched between insulating layers 212 and 214, and conducting layer 234 is sandwiched between insulating layers 214 and 216. Insulating layers 210, 212, 214, and 216 represent a bulk material of PCB 200, and may include a bulk material including a resin impregnated laminate material, such as a FR-X type material, a CEM-X type material, a G-10 type material, or another suitable bulk material, as needed or desired. Conducting layers 222, 232, and 234 represent thin layers of copper or another conducing material suitable for the and the provision of power to the circuits of PCB 200 and the transmission of the signals associated with the circuits of the PCB.

PCB 200 includes signal vias 220 and one or more ground vias 230. Signal vias 220 represent the conductors of a differential signal pair of a high-speed serial interface. As such, one of signal vias 220 represents a non-inverted leg of the differential signal pair and the other one of signal vias 220 represents an inverted leg of the differential signal pair. Signal vias 220 span from the top surface of insulating layer 210 to conductive layer 222, and are utilized to electrically connect signal traces formed on the top surface of the insulating layer to signal traces formed within the conductive layer. Ground vias 230 represent vias formed in PCB 200 that are position to provide a good current return path for the signals carried on signal vias 220, to shield against electromagnetic interference (EMI) effects, to provide immunity from crosstalk from other nearby signal traces on the PCB, and to otherwise improve the quality of the signals carried by the signal vias. As such, ground vias 230 are electrically connected to conducting layers 232 and 234 which are electrically connected to a circuit ground (GND) of PCB 200.

Vias 220 and 230 may be fabricated in PCB 200 as through-hole drilled vias (vias extending from a top surface of the PCB to a bottom surface of the PCB), blind vias (vias extending from a top or bottom surface of the PCB to only part way through the PCB), buried vias (vias that are completely within inner layers of the PCB and do not extend to either the top or bottom surface of the PCB), or as other types of layer spanning vias, as needed or desired. Further, vias 220 and 230 may be fabricated as copper plated vias, as copper filled vias, as copper plated and epoxy filled vias, or other types of conductor forming vias, as needed or desired. The details of PCB fabrication are known in the art and will not be further described herein except as needed to illustrate the present embodiments.

Figure 3:
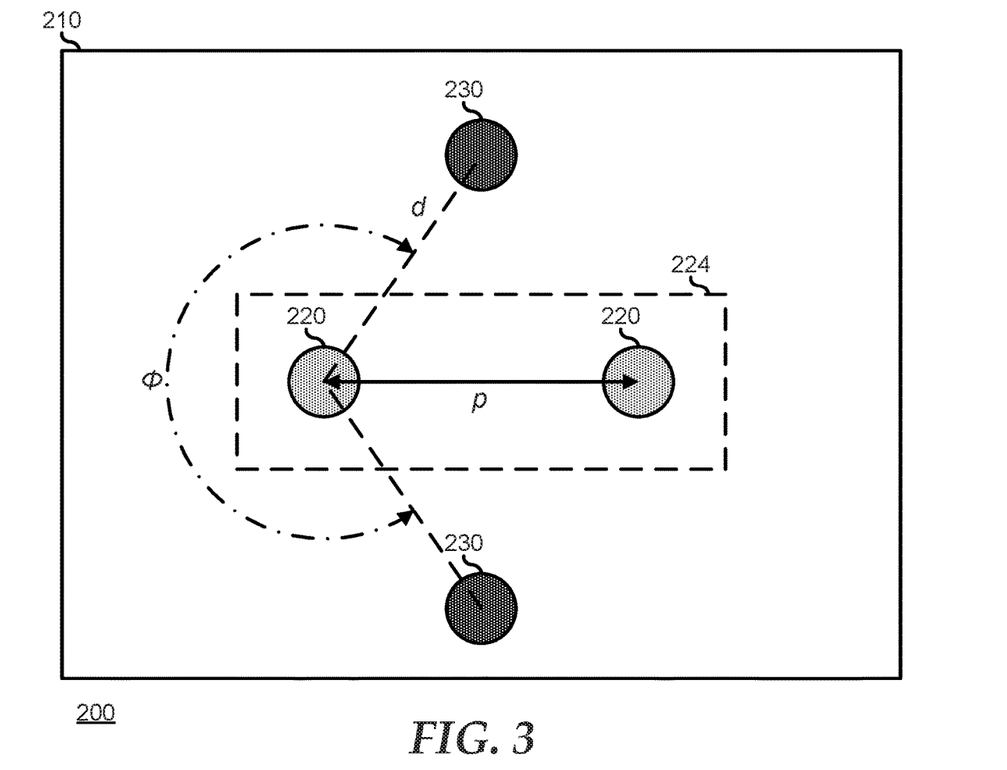
FIG. 3 is a top view of the PCB of FIG. 2.

FIG. 3 illustrates a top view of PCB 200 including top insulating layer 210, signal vias 220, ground vias 230, and an anti-pad area 224. Anti-pad area 224 is illustrated with a dashed line to represent that the anti-pad is an exclusion zone in the power and ground layers of PCB 200. That is, the power and ground conductor material in the power and ground layers are etched around signal vias 220 to keep the signals from shorting to the power and ground layers, and to provide improved signal quality. The design of anti-pads is known in the art and will not be further described herein except as needed to illustrate the present embodiments.

Figure 4:
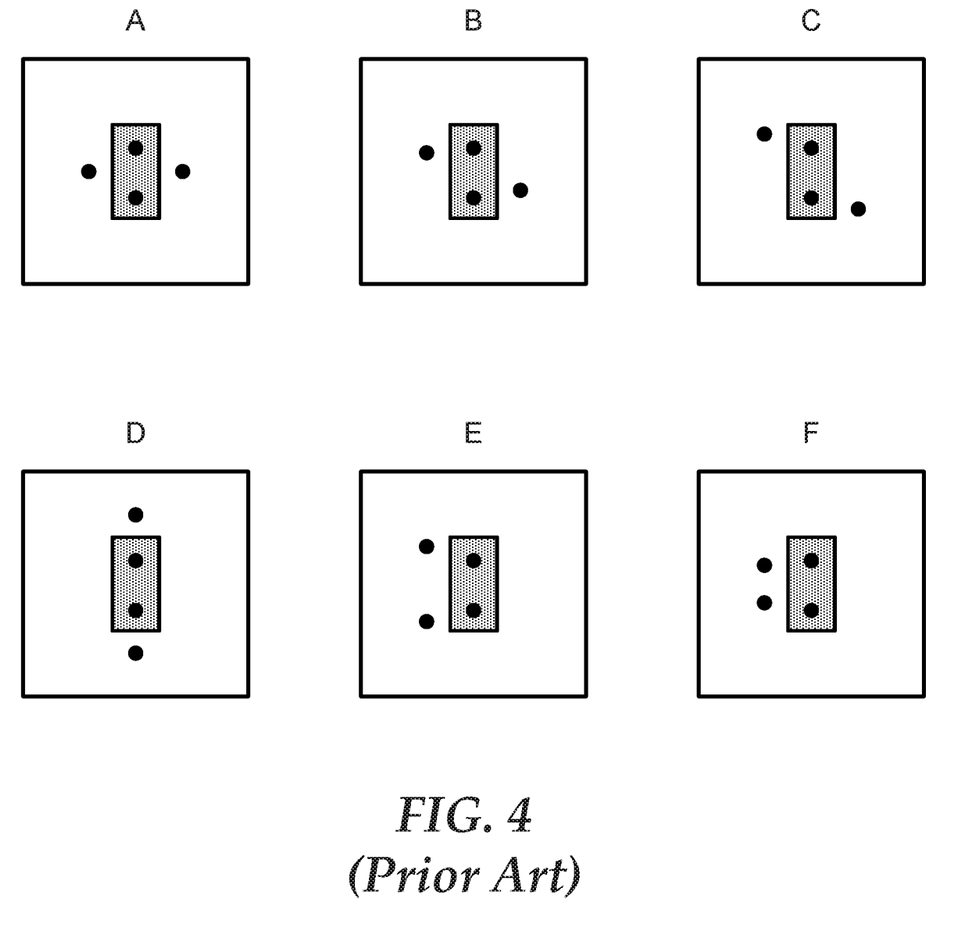
FIG. 4 is a top view of via arrangements in a PCB according to the prior art.

A particular challenge in the design of a PCB is how may ground vias are needed for a particular high-speed differential signal pair. Another challenge in the design of a PCB is where to place the selected number of ground vias in relation to the high-speed differential signal pair vias. Designers typically depend on experience in determining the number and placement of ground vias in relation to the high-speed differential signal pair vias in a particular PCB design, relying on past designs to give inferences as to the effect of the via placement on the associated signal quality. One approach is to simply place vias symmetrically around the high-speed differential signal pair. FIG. 4 illustrates six different symmetrical arrangements of two ground vias. Other numbers of ground vias may be symmetrically arranged around a high-speed differential signal pair.

Returning to FIG. 3, signal vias 220 are illustrated as being separated by a pitch distance (p), and ground vias 230 are illustrated as being a distance (d) from one of the ground vias. Ground vias 230 are further illustrated such that a first segment formed between a first signal via 220 and a first ground via 230, and a second segment formed between the first signal via 220 and the second ground via 230 form an angle (Φ), and where the angle (Φ) is measured to a side of the first signal via that is opposite to the second signal via 220. In a particular embodiment, where the number of ground vias is equal to two (2), the angle (Φ) is given as:

$$\Phi=[360°-2*\cos^{-1}(p/2d)]/2 \qquad \text{Equation 1}$$

Figure 5:
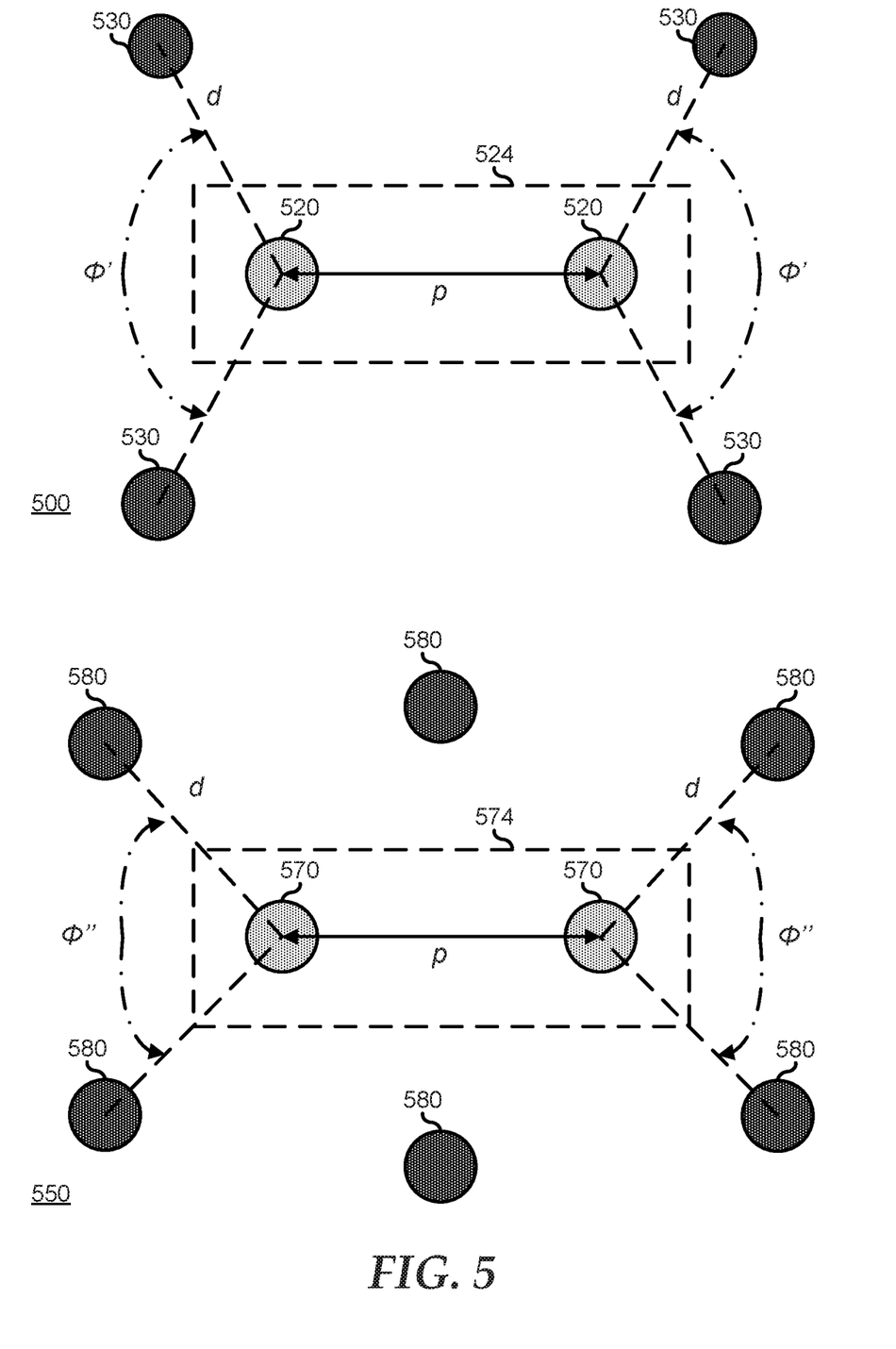
FIG. 5 is a top view of via arrangements in a PCB according to embodiments of the present disclosure.

FIG. 5 illustrates via arrangements 500 and 550. In via arrangement 500, signal vias 520 similar to signal vias 220 are surrounded by an anti-pad area 524 similar to anti-pad area 222. Here, four ground vias 530 are placed around signal vias 520. Here, the angle (Φ') is determined as:

$$\Phi'=[360°-2*\cos^{-1}(p/2d)]/3 \qquad \text{Equation 2}$$

Via arrangement 550 includes signal vias 570 similar to signal vias 220 that are surrounded by anti-pad area 574 similar to anti-pad area 224, and the six ground vias 580 are placed around the signal vias. Here, the angle (Φ'') is determined as:

$$\Phi''=[360°-2*\cos^{-1}(p/2d)]/4 \qquad \text{Equation 3}$$

In general, an angle (Φ) is determined as:

$$\Phi=[360°-2*\cos^{-1}(p/2d)]/(n/2+1) \qquad \text{Equation 4}$$

where n is the number of ground vias. Table 1, below, gives values for the angle (Φ) for different numbers of ground vias and different distances (d) between a ground via and a signal via in accordance with Equation 4.

TABLE 1

Ground Via Layout Angles (Φ)

| d | n | Φ |
|---|---|---|
| d = 0.6p | n = 2 | 146° |
| d = 0.6p | n = 4 | 98° |
| d = 0.6p | n = 6 | 73° |
| d = 0.8p | n = 2 | 129° |
| d = 0.8p | n = 4 | 86° |
| d = 0.8p | n = 6 | 64° |
| d = 1.0p | n = 2 | 120° |
| d = 1.0p | n = 4 | 80° |
| d = 1.0p | n = 6 | 60° |

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims.

In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A printed circuit board (PCB) for an information handling system, the PCB comprising:
   first and second signal vias, the first signal via being separated from the second signal via by a distance (p);
   a quantity (n) of ground vias, n being an even non-zero positive integer, the n ground vias being grouped into pairs, each ground via of each pair being separated from one of the first or second signal vias by a distance (d), wherein an angle (θ) between the ground vias of a particular pair is given by an expression:

$$\Phi=[360°-2*\cos^{-1}(p/2d)]/(n/2+1),$$

wherein d is not equal to p.

2. The PCB of claim 1, further comprising:
   a conducting layer embedded between insulating layers of the PCB, wherein the first and second signal vias are connected to the conducting layer.

3. The PCB of claim 2, further comprising:
   a ground layer coupled to a circuit ground and embedded between insulating layers of the PCB, wherein the first and second ground vias are connected to the ground layer.

4. The PCB of claim 3, wherein the ground layer lays between a surface of the PCB and the conducting layer.

5. The PCB of claim 4, wherein the first and second signal vias pass through the ground layer.

6. The PCB of claim 5, wherein the ground layer includes an anti-pad area where the first and second signal vias pass through the ground layer.

7. The PCB of claim 1, wherein the quantity (n) of ground vias is equal to two (2), four (4), or six (6) ground vias.

8. The PCB of claim 1, wherein the first and second signal vias make up a differential signal pair for a high-speed serial interface.

9. A method, comprising:
   placing, in a printed circuit board (PCB), first and second signal vias, the first signal via being separated from the second signal via by a distance (p); and
   placing, in the PCB, a quantity (n) of ground vias, n being an even non-zero positive integer, the n ground vias being grouped into pairs, each ground via of each pair being separated from one of the first or second signal vias by a distance (d), wherein an angle (Φ) between the ground vias of a particular pair is given by an expression:

$$\Phi=[360°-2*\cos^{-1}(p/2d)]/(n/2+1),$$

wherein d is not equal to p.

10. The method of claim 9, further comprising:
    embedding a conducting layer between insulating layers of the PCB; and
    connecting the first and second signal vias to the conducting layer.

11. The method of claim 10, further comprising: embedding a ground layer between insulating layers of the PCB; coupling the ground layers to a circuit ground; and connecting the first and second ground vias to the ground layer.

12. The method of claim 11, wherein the ground layer lays between a surface of the PCB and the conducting layer.

13. The method of claim 12, wherein the first and second signal vias pass through the ground layer.

14. The method of claim 13, wherein the ground layer includes an anti-pad area where the first and second signal vias pass through the ground layer.

15. The method of claim 9, wherein the quantity (n) of ground vias is equal to two (2), four (4), or six (6) ground vias.

16. The method of claim 9, wherein the first and second signal vias make up a differential signal pair for a high-speed serial interface.

17. An information handling system, comprising:
a component having differential signal pair for a high-speed serial interface; and
a printed circuit board (PCB) having the component affixed thereto, the PCB including:
a first signal via coupled to a first signal lead of the differential pair;
a second signal via coupled to a second signal lead of the differential pair, the first signal via being separated from the second signal via by a distance (p); and
a quantity (n) of ground vias, n being an even non-zero positive integer, the n ground vias being grouped into pairs, each ground via of each pair being separated from one of the first or second signal vias by a distance (d), wherein an angle ($\Phi$) between the ground vias of a particular pair is given by an expression:

$$\Phi=[360°-2*\cos^{-1}(p/2d)]/(n/2+1),$$

wherein d is not equal to p.

18. The information handling system of claim 17, wherein the PCB further includes:
a conducting layer embedded between insulating layers of the PCB, wherein the first and second signal vias are connected to the conducting layer.

19. The information handling system of claim 18, wherein the PCB further includes:
a ground layer coupled to a circuit ground and embedded between insulating layers of the PCB, wherein the first and second ground vias are connected to the ground layer, wherein the ground layer lays between a surface of the PCB and the conducting layer.

20. The information handling system of claim 19, wherein the first and second signal vias pass through the ground layer, and wherein the ground layer includes an anti-pad area where the first and second signal vias pass through the ground layer.

* * * * *

UNITED STATES PATENT AND TRADEMARK OFFICE
CERTIFICATE OF CORRECTION

PATENT NO. : 10,993,312 B2  
APPLICATION NO. : 16/385579  
DATED : April 27, 2021  
INVENTOR(S) : Sanjay Kumar et al.

Page 1 of 1

It is certified that error appears in the above-identified patent and that said Letters Patent is hereby corrected as shown below:

Column 8, Line 23, Claim 1: Please change "angle (0) between" to --angle (Φ) between--

Signed and Sealed this  
Fifteenth Day of June, 2021

Drew Hirshfeld  
*Performing the Functions and Duties of the*  
*Under Secretary of Commerce for Intellectual Property and*  
*Director of the United States Patent and Trademark Office*